US008115484B2

(12) United States Patent
Heid et al.

(10) Patent No.: US 8,115,484 B2
(45) Date of Patent: Feb. 14, 2012

(54) METHOD AND DEVICE TO GENERATE A MEASUREMENT SEQUENCE FOR OPERATING A MAGNETIC RESONANCE SYSTEM THAT IS ADAPTED TO THE TIME RASTER OF THE SYSTEM

(75) Inventors: Oliver Heid, Gunzenhausen (DE); Thomas Kluge, Hirschaid (DE)

(73) Assignee: Siemens Aktiengesellschaft, Munich (DE)

( * ) Notice: Subject to any disclaimer, the term of this patent is extended or adjusted under 35 U.S.C. 154(b) by 241 days.

(21) Appl. No.: 12/549,475

(22) Filed: Aug. 28, 2009

(65) Prior Publication Data
US 2010/0052678 A1 Mar. 4, 2010

(30) Foreign Application Priority Data
Aug. 28, 2008 (DE) .................. 10 2008 044 827

(51) Int. Cl.
*G01V 3/00* (2006.01)
(52) U.S. Cl. ....................................... 324/309; 324/307
(58) Field of Classification Search .......... 324/300–322; 600/407–445
See application file for complete search history.

(56) References Cited

U.S. PATENT DOCUMENTS

| 4,707,661 | A | 11/1987 | Hoenninger, III et al. | |
|---|---|---|---|---|
| 5,144,242 | A | 9/1992 | Zellenga et al. | |
| 5,519,320 | A | 5/1996 | Kanayama et al. | |
| 6,320,380 | B1 | 11/2001 | Wu et al. | |
| 6,788,055 | B2 | 9/2004 | McKinnon et al. | |
| 6,806,709 | B2 * | 10/2004 | Markl et al. | 324/309 |
| 7,408,346 | B2 * | 8/2008 | Szyperski et al. | 324/307 |
| 7,443,166 | B2 * | 10/2008 | Heid | 324/322 |
| 7,474,097 | B2 * | 1/2009 | Bydder et al. | 324/307 |
| 7,982,462 | B2 * | 7/2011 | Goelman et al. | 324/309 |
| 2004/0263166 | A1 * | 12/2004 | Kluge | 324/309 |
| 2008/0024129 | A1 * | 1/2008 | Heid | 324/307 |
| 2010/0090694 | A1 * | 4/2010 | Heid et al. | 324/309 |
| 2011/0118587 | A1 * | 5/2011 | Roemer et al. | 600/411 |

FOREIGN PATENT DOCUMENTS
WO WO 2007/121020 10/2007

OTHER PUBLICATIONS

"Echoes—How to Generate, Recognize, Use or Avoid Them in MR-Imaging Sequences, Part I: Fundamental and Not So Fundamental Properties of Spin Echoes," Hennig, Concepts in Magnetic Resonance, vol. 3 (1991), pp. 125-143.
"Parameter Relations for the Shinnar-Le Roux Selective Excitation Pulse Design Algorithm," Pauly et al., IEEE Trans. on Medical Imaging, vol. 10, No. 1 (1991) pp. 53-65.

* cited by examiner

*Primary Examiner* — Brij Shrivastav
(74) *Attorney, Agent, or Firm* — Schiff Hardin LLP (57) ABSTRACT

In a method for producing a time raster-adapted measurement sequence that can be executed directly in the time raster of a magnetic resonance (MR) scanner, for a measurement sequence composed of a series of time slices that in their entirety represent the measurement sequence, the predetermined time slices are not necessarily of a suitable length in order to be directly translated into the time raster of the MR scanner. The method according to the invention produces this conversion automatically and additionally ensures that global properties of the measurement sequence are maintained. The method simplifies the programming of measurement sequences for MR. Moreover, the method is a requirement for the direct use of timing values determined by a solver. The method can be executed by a computerized device and can be implemented in the form of programming instructions encoded in a computer-readable medium.

12 Claims, 3 Drawing Sheets

FIG 3

METHOD AND DEVICE TO GENERATE A MEASUREMENT SEQUENCE FOR OPERATING A MAGNETIC RESONANCE SYSTEM THAT IS ADAPTED TO THE TIME RASTER OF THE SYSTEM

RELATED APPLICATION

The present application is related to an application filed simultaneously herewith, owned by the same Assignee, entitled "Method and Device for Automated Generation of a Formal Description of a Magnetic Resonance System Measurement Sequence, Using a Sequence Model," having U.S. Ser. No. 12/549,460.

BACKGROUND OF THE INVENTION

1. Field of the Invention

The present invention concerns a method to generate a time raster-adapted measurement sequence for a magnetic resonance scanner (also abbreviated as an MR scanner) that can be executed in compatibility with the time raster of the magnetic resonance scanner. The invention thus in particular concerns translating predetermined time slices of a measurement sequence such that they can be executed in compatibility with the time raster of a magnetic resonance scanner.

The present invention also concerns a magnetic resonance scanner, and in particular programming of a controller therefor.

2. Description of the Prior Art

Magnetic resonance scanners today are a staple component of the clinical routine for examination of patients in hospitals. Magnetic resonance scanners also can be used for the examination of animals or biological samples. Magnetic resonance (also called nuclear magnetic resonance) as an imaging method was developed in the 1980s. Essentially, this method is sensitive to the mobility of water in tissue, for instance the human body.

The generation of magnetic resonance images in an MR scanner requires an exact, temporal workflow between the radio-frequency excitation of the spins, the spatial coding and the detection of the resonant response of the spin. The temporal workflow of the excitation, preparation and detection is called a pulse sequence or measurement sequence. The measurement sequence is composed of a series of time slices, each of the time slices having a specific length and at least one pulse with a pulse shape is associated with each time slice. Each of the time slices can be associated with a type from among transmission type for transmission of a radio-frequency (RF) pulse, and/or reception type to detect the resonant response of the nuclear spins as an RF signal, and warp type (WT) to prepare the nuclear spins. For the transmission type, differentiation is made between an excitation pulse to excite the nuclear spins and a refocusing pulse to refocus the nuclear spins. It is possible for a transmitted RF pulse to serve both to refocus and to excite the nuclear spins. In this context stimulated echo signals are produced by RF pulses both for excitation and for refocusing of the nuclear spins. A good introduction to echo creation is provided by Hennig, J. in "Echoes—How to Generate, Recognize, Use or Avoid them in MR-Imaging Sequences" in Concepts in Magnetic Resonance 3 (1991), 125-143.

Over the years a number of MR sequences or measurement sequences have been developed that serve very different purposes. For example, it is possible to significantly affect the contrast of an image by the suitable selection of a measurement sequence. The preparation of the spin system—for example by means of RF pulses, gradient pulses, wait times and so forth—thus has a decisive influence on the quality and property of the acquired magnetic resonance image.

The creation or the programming of the measurement sequence requires a high degree of expertise due to the sensitive connection between time workflows (also called timing conditions) and the individual pulses in the time slices of the measurement sequence. The design of measurement sequences has developed into its own field of MR physics, and a number of parameters that determine the quality of the image.

Today thoroughly complex MR sequences are used that, for example, enable images from the inside of the body to be acquired in real time, for instance of the beating heart. The programming of such measurement sequences requires the sequence programmer to take a number of conditions into account. In particular, a magnetic resonance scanner has at least one time raster in which events can occur (time slices with pulses begin and/or end, for example).

This means that all events within the measurement sequence are subservient to such a time raster in order to be executed by the MR scanner. Moreover, it is normally the case that an MR scanner has multiple, different rough time rasters: a more coarse resolution of raster for the gradient systems and a finer one for the radio-frequency systems (RF systems for short). Skill and a great deal of effort by a sequence programmer are required in order to make sure that pulses and events within a measurement sequence satisfy the narrow (physically predetermined) time conditions on the one hand and/or match the schedule of a magnetic resonance scanner.

Conventionally, the sequence programmer alone has made sure that timing conditions as they are predetermined by the physical behavior of the nuclear spins are maintained.

SUMMARY OF THE INVENTION

An object of the subject matter of the present invention is to simplify and to qualitatively improve the measurement sequence programming by means of the proposed method. The inventive method allows an automatic translation of predetermined time durations for the transmission of an RF pulse and/or reception of an RF signal so that this time duration matches the schedule of a magnetic resonance scanner. This means that predetermined values for the time duration of the transmission and/or reception window that do not per se match the time raster of the magnetic resonance scanner are modified by the inventive method so that the exact, predetermined timing correlations between individual time slices are maintained, while at the same time the measurement sequence can be executed as a time raster-adapted measurement sequence in the time raster of the MR scanner.

The above object also is achieved in accordance with the present invention by a computerized device that automatically implements the method according to the invention, a magnetic resonance data acquisition system (magnetic resonance scanner) operated by a controller that implements the method according to the invention, as well as by a computer-readable medium encoded with programming instructions that, when the medium is loaded into a computerized device, cause the computerized device to execute the method in accordance with the present invention.

The above object is achieved by a method to generate a time raster-adapted measurement sequence for a magnetic resonance scanner that can be executed in compatibility with the time raster of the magnetic resonance scanner, starting from a predetermined measurement sequence, wherein the predetermined measurement sequence is composed of a series of time slices of arbitrary length of the transmission type and/or reception type, and a time duration $T_x$ is associated with every time slice, and wherein the time duration $T_x$ describes the transmission and/or reception window in which a respective radio-frequency pulse (RF pulse) of the pulse shape $P_x$ is sent and/or an RF signal is received. In accordance with the invention, the predetermined measurement sequence is provided and the time raster of the MR scanner is determined, as are optimization criteria for an abbreviation (shortening) of the time durations $T_x$ for each of the respective time slices. Each of the time durations $T_x$ of the time slices is shortened to a respective shortened time duration $T_{xi}$, and each of the shortened time durations $T_{xi}$ fits the defined time raster, without a remainder, and lies completely within the time duration $T_x$, and optionally satisfies the optimization criteria. The time raster-adapted measurement sequence, and the time duration $T_x$ is replaced with the shortened time duration $T_{xi}$ for each of the time slices. Global (overall) properties of the measurement signal are maintained upon execution of the time raster-adapted measurement sequence.

As used herein, "measurement sequence", means a sequence of time slices of arbitrary length, in which the predetermined length does not necessarily match the time raster of the MR scanner. When it is executed in an MR scanner, the sequence of time slices of a measurement sequence results in the generation of an image of the inside of the body of the patient. In a measurement sequence, time slices are seamlessly joined. The method according to the invention merely varies properties of that those time slices of the transmission type and/or reception type, thus those time slices with which an RF pulse of the pulse shape $P_x$ is sent and/or an RF signal is received.

The time duration $T_x$ designates the transmission and/or reception window in which an RF pulse of a pulse shape $P_x$ is sent and/or an RF signal is received.

The term "time raster" is based on the minimum separation (interval) between successive events (also called a minimum time raster interval) that the scanner can differentiate. For example, for gradient systems this is the switching of a rising gradient, or for the RF system this is the emission of an RF pulse or the reception of a response from the sample.

The length of a time slice is typically in the range of milliseconds. For a gradient pulse, the pulse duration is normally not longer than 30 ms, for example. Moreover, a pulse shape $P_x$ is associated with every time slice. The pulse shape describes the amplitude and the time curve of a pulse, for example a gradient pulse or an RF excitation pulse. For example, gradient pulses can thus be trapezoidal, with predetermined duration and/or predetermined edge steepness. Radio-frequency pulses can have a sinc(x) shape, for example. Moreover, it is possible that a pulse frequency contains a time slice that is associated with an empty (blank) pulse shape. An empty pulse shape is characterized in that the amplitude of the pulse is 0 over the entire length. This means that no pulse at all is executed; rather, a pause occurs instead.

It is normally possible to provide a measurement sequence as a series of time slices that do not necessarily match the time raster of the MR scanner. According to the invention, an (actually unusable), non-matching measurement sequence can nevertheless be used and executed in the MR apparatus.

As used herein, "time raster-adapted measurement sequence", means a measurement sequence composed of individual time slices for which the time duration $T_x$ of the transmission and/or reception window was shortened so that the shortened time durations $T_{xi}$ of the transmission and/or reception window fit the specific time raster of the MR scanner without remainder.

As used herein "optimization criteria", means conditions that either exist due to hardware limitations, or must be adhered to due to the physical properties of the spin system. There are also those optimization conditions that result from requirements for the image to be generated. Such optimization conditions are specified in detail below.

As used herein, "global properties of the measurement sequence", means properties of the measurement sequence that characterize their workflow. For example, the repetition time, the echo time at which an echo is generated or the inversion time belong among these parameters or global properties. Additional parameters are also conceivable, for example gradient moments. The cited global properties of a measurement sequence have a decisive influence on the image quality and/or the image contrast of an MR image that is generated with such a measurement sequence.

The method according to the invention is described in the following for time slices of the transmission type, in particular for an abbreviation of the transmission and/or reception window of such a time slice. This formulation has the advantage that the limits of the time slices are not altered by the method. For the execution of the method according to the invention, this means that it is sufficient to consider individual time slices. One time slice can thus be executed after the other without the preceding or following time slices having to be taken into account.

It will be apparently to those skilled in the art in the field of measurement sequence programming, based on the disclosure provided herein, the method according to the invention can also be formulated alternatively. Without deviating from the subject matter of the present invention, the method could also be formulated so that the time duration of the time slices of the transmission type are shortened and are present according to the method as shortened time slices. Naturally, for such a variant of the method the time slice preceding the shortened time slice of the transmission type would have to be extended accordingly, as well as the time slice following the shortened time slice of the transmission type, so that global properties of the measurement sequence are maintained. However, such a formulation of the method according to the invention can no longer be realized via an isolated consideration of individual time slices of the transmission type. Therefore the implementation of the method by shortening the transmission and/or reception window of the time duration $T_x$ to the shortened time duration $T_{xi}$ is exemplary in the present disclosure. Through this selection the problem is solved "locally" in individual time slices without a predecessor of the time slice and/or a successor of the time slice having to be known. The selection made within the scope of this disclosure to describe the method does not represent a limitation of the method according to the invention.

According to a further embodiment of the invention, the method can additionally comprise that the measurement sequence is provided by a solver. A suitable solver is described in German Patent DE 10 2006 034 397 B3.

According to a further embodiment of the invention, the method according to the invention can provide a reliable value range for a number of nodes via optimization criteria.

The term "nodes" as used herein means those points on the time raster of the MR scanner that can be used in order to translate a continuously provided pulse shape into the time raster of the MR scanner. In this translation it is frequently necessary for the surface integral under the pulse shape to remain the same in the transmission of a continuous pulse shape at a number of nodes.

In a further embodiment with the optimization criteria, the method according to the invention can include a set of additional time rasters that result from enlarging the defined time raster.

In a further embodiment, the method according to the invention can be fashioned so that the optimization criteria comprise a maximization of a product from a number of the nodes and a schedule interval.

The effort to maximize the product of number of nodes and the schedule interval results from the interest in digitizing pulse shapes and/or digitizing analog acquired RF signals with optimally high information density.

In a further embodiment, the method according to the invention can furthermore include correction of the pulse shape $P_x$ upon transmission of an RF pulse so that the corrected pulse shape lies entirely within the shortened time duration $T_x$. For this, the length of the pulse shape $P_x$ can either be scaled to $T_{xi}$, which leads to a slice thickness increased by a factor of $T_x/T_{xi}$. Alternatively, a re-scanning of the pulse shape $P_x$ to the shortened interval $T_{xi}$ is possible. The bandwidth time product is thereby reduced by $T_{xi}/T_x$ and the point spread function is therefore broader. This error lies in the range of tenths of a percent to a few percent of $T_x/T_{xi}$.

In a further embodiment, the method according to the invention can moreover comprise the following steps [sic]: correction of an acquired MR image with regard to an error introduced for each of the time slices upon acquisition of the RF signal due to the use of the shortened time duration $T_{xi}$. Due to the shortened time durations $T_{xi}$, scanned k-space is reduced by $T_{xi}/T_x$; the point spread function is therefore broader, whereby the resolution in the readout direction is reduced. This error is likewise in the tenths of a percent to percent range.

The method is likewise applicable to all complex time slices of the transmission type, for example VERSE, 2D excitation, frequency-selective excitation and the like. Moreover, the method is also applicable to more complex time slices of the reception type, for example in the form of spirals and/or combined time slices of the transmission and/or reception type. The handling of the shortened $T_{xi}$, and therefore the reduced gradient moment during the transmission and/or reception, is required by the system at the run time of the measurement sequence and must be handled individually for all time slices of the transmission and/or reception type that are used in the sequence development.

In a further embodiment, the method according to the invention can include detection of hardware limitations, and checking the measurement sequence as to whether the detected hardware limitations are adhered to. Hardware limitations result from (for example) the allowed edge steepness for gradient pulses, since limit values for variable magnetic fields are predetermined. For example, the predetermined limit values can serve to prevent a peripheral nerve stimulation of the patient.

In a further embodiment, the method according to the invention includes identifying relevant patient safety guidelines, and checking whether these patient safety guidelines are complied with for the predetermined measurement sequence. The method according to the invention is therefore in the position to take into account patient safety guidelines (for instance with regard to tissue-typical absorption rates for RF power) that establish the permissible RF power that can be absorbed by specific tissue (for instance soft tissue in the abdominal area). These are formulated as SAR limit values, wherein SAR stands for specific absorption rate.

Moreover, the method facilitates automatic compliance with limit values over the course of the measurement sequence for the time raster-adapted measurement sequence. No additional method steps are necessary to achieve this. In other words, if the limit values and guidelines for the predetermined measurement sequence are satisfied, these are also automatically satisfied in the time raster-adapted measurement sequence generated according to the method.

The object of generating a time raster-adapted measurement sequence is also achieved in accordance with the invention by a device to generate a time raster-adapted measurement sequence for an MR scanner that can be executed in compatibility with the time raster of the MR scanner, starting from a predetermined measurement sequence, wherein the predetermined measurement sequence is composed of a series of time slices of arbitrary length of the transmission type and/or of the reception type, and a time duration $T_x$ is respectively associated with each time slice, and the time duration $T_x$ describes the transmission and/or reception window in which an RF pulse of the pulse shape $P_x$ is respectively sent and/or an RF signal is respectively received.

The device has an input interface module, a time raster interface module, an optimization criteria interface module, a shortening module, and a generator module.

The input interface module is designed to receive the predetermined measurement sequence. The time raster interface module is designed to receive the time raster of the MR scanner. The optimization criteria interface module is designed to receive optimization criteria for a shortening of the time durations $T_x$. As used herein "receive" encompasses both automatic importation and manual entry of input values. For this purpose, the shortening module is designed to shorten time durations $T_x$, to shortened time durations $T_{xi}$, for each of the respective time slices, so that each of the shortened time durations $T_{xi}$ fits the determined time raster without remainder and lies entirely within the time slice, and the optimization criteria are optionally satisfied.

The generator module is designed to generate a time raster-adapted measurement sequence, wherein for each of the time slices the time duration $T_x$ is replaced with the shortened time duration $T_{xi}$, and global properties of the measurement sequence are maintained upon execution of the time raster-adapted measurement sequence.

Such a device can be a hardware module that automatically generates the time raster-adapted measurement sequence from a predetermined measurement sequence.

The method according to the invention is implementable by an MR scanner with a control unit that is fashioned to execute a time raster-adapted measurement sequence generated according to the method according to the invention. It is possible to directly execute such a method in an MR scanner insofar as the MR scanner possesses a suitable control unit that can execute the method according to the invention.

As also noted above, the present invention encompasses a computer-readable medium encoded with programming instructions that, when the medium is loaded into a computerized device, cause the computerized device to execute the method, and all embodiments thereof, described above.

In a further embodiment, the system according to the invention can include a solver to provide the predetermined measurement sequence.

As used herein "solver", means a module that is normally implemented as software. The solver serves to numerically solve mathematically formulated problems. In the event that, for example, an MR timing problem is formulated in a suitable form, it can be solved by the solver.

Moreover, it is possible for individual components of the method described herein to be executed in a first commercial

DESCRIPTION OF THE PREFERRED EMBODIMENTS

Figure 1:
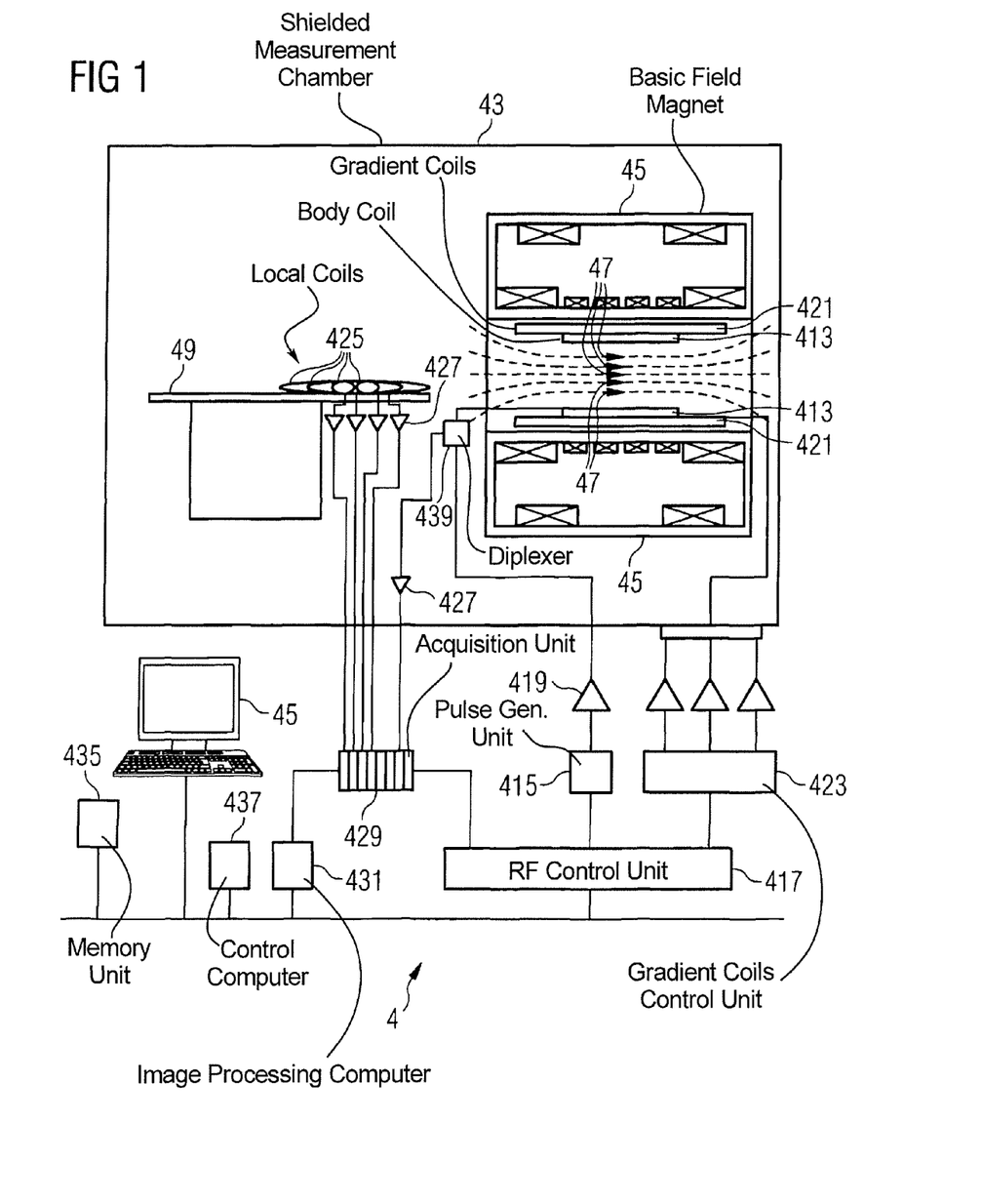
FIG. 1 is a block diagram of the individual components of a magnetic resonance (MR) scanner.

FIG. 1 shows the principle design of an MR scanner 4 with its basic components. In order to examine a body by means of MR imaging, various temporally variable magnetic fields that are tuned exactly to one another are radiated towards the body, and this leads to a resonant response of the nuclear spins to the radiated radio-frequency energy (abbreviated as RF).

In a measurement chamber 43 shielded against radio-frequencies, a basic field magnet 45 (for example typically a superconducting magnet 45) is provided that is cooled by liquid coolant. The magnet 45 with a cylindrical opening generates a static basic magnetic field 47 that is typically in the range from 0.1 Tesla to 3 Tesla or more of field strength. The basic magnetic field 47 has a high homogeneity, typically in a range of a few ppm for a volume of (for example) 15 cm diameter. A body or a body part to be examined (not shown in FIG. 1) is borne on a patient bed 49 and positioned in a homogeneous region of the basic magnetic field 47.

In general, nuclear magnetic resonance (or magnetic resonance) is based on the fact that magnetic moments (known as spins of the atomic nuclei, i.e. the nuclear spins), for example of the protons, align in a strong external magnetic field. For protons in a provided strong magnetic field (for instance the basic magnetic field 47 of an MR scanner 4) there are two energetically different states. The occupation of these two states ensues according to Boltzmann statistics. Depending on the strength of the basic magnetic field 47, an energy difference between the two states results. In particular, this energy difference allows transitions between the two possible states to be induced by radiation of radio-frequency energy in the form of temporally variable magnetic fields, i.e. RF pulses.

A resonant response of the spin system thus occurs upon RF excitation. It is convenient to produce the RF excitation by radiating RF pulses. Such RF pulses can serve to excite the nuclear spin system and/or to refocus the nuclear spin system, as already mentioned.

Information about the mobility of the nuclear spins can then be derived from the resonant response of the nuclear spins inside the body. Since living tissue (and in particular the human body) is composed in large part of water, and the water molecules have two hydrogen nuclei (thus protons) that carry a magnetic nuclear spin, an excitation by magnetic resonance is easily possible for the human body. In particular, in this modality the mobility of the nuclear spins (and therefore of the water molecules) can be examined. MR thus provides information of how strongly water is bound in different tissue types. For example, water in adipose tissue is significantly less mobile and therefore can respond more slowly to an RF excitation than water in fluids (for example blood).

The excitation of the nuclear spins in the human body, i.e. normally of the protons in the human body, ensues via magnetic RF pulses that are radiated via a radio-frequency antenna (shown in FIG. 1 as a body coil 413). Naturally, the MR examination of nuclei other than the protons (for example lithium or sulfur) is also possible.

As an alternative to the use of the body coil 413 it is also possible to use special excitation coils or radio-frequency antennas adapted to the anatomy, for instance as head coils. The RF excitation pulses required for excitation are generated by a pulse generation unit 415 that is controlled by a pulse frequency (RF) control unit 417. After an amplification by a radio-frequency amplifier 410, the RF excitation pulses are conducted to the radio-frequency antenna.

The RF system shown in FIG. 1 only schematically indicated. More than one pulse generation unit 415, more than one radio-frequency amplifier 419 ad multiple radio-frequency antennas are possibly used in an MR scanner or additional modules. In particular, it is possible to use whole groups of antennas, whereby an improvement of a signal-to-noise ratio can be achieved on the one hand and/or noise effects are dominated by properties of the sample. Phased arrays, as are known to those skilled in the art, are noted suitable for use as antennas in this context.

The magnetic resonance scanner 4 has gradient coils 421 with which magnetic gradient fields for selective slice excitation and for spatial coding of the measurement signal are radiated in a measurement. The gradient coils 421 are controlled by a gradient coil control unit 423 that, like the pulse generation unit 415, is connected with the pulse frequency control unit 417.

Typically three gradient systems are used in order to be able to produce spatial codings in all three directions. These gradient systems are normally orthogonal. However, non-orthogonal, curvilinear gradient systems for MR imaging are also conceivable.

The signal emanating from the excited nuclear spin—thus the response to the resonant excitation—is received by a reception coil (for example the body coil 413 and/or local coils 425), amplified by associated radio-frequency amplifier 427 and additionally processed and digitized by an acquisition unit 429. For the transmission coils, it also applies for the local coils 425 for reception that the use of smaller coils adapted to the geometry of the region of the body to be examined (for instance surface coils) is advantageous under the circumstances in order to improve the signal-to-noise ratio.

Since, according to the reciprocity principle, good transmitters are also good receivers, it is possible to operate a coil as both a transmission coil and a reception coil. In the case of the use of a coil as a transmission and reception coil, however, it is necessary to ensure a correct signal relaying. This normally occurs via a transmission/reception diplexer 439. For example, a circulator is considered as a transmission/reception diplexer.

An image processing unit 431 generates from the measurement data an MR image that is presented to a user via an operator console 433 or is stored in a memory unit 435. A computer 437 that interferes with the console 433 controls the individual components of the MR scanner 4. The control computer 437 and the console 433 are fashioned so that the method according to the invention can be implemented with it.

MR images result via a systematic sampling of frequency space (also called k-space). This sampling of k-space is achieved via suitable sequences of gradient pulses and excitation pulses. Measurement sequences 100 provide a method for how k-space should be traversed. They thus establish the k-space trajectory. For the use of MR in everyday clinical situations it is desirable to find optimally efficient k-space trajectories so that diagnostic images can consequently be generated quickly and efficiently. Today there are many measurement sequences 100 that use elaborate and complex strategies in order to sample k-space.

In addition to the time efficiency of the measurement sequence 100, the contrast response for a generated image is also relevant. Depending on the selected measurement sequence 100, quickly responding or slowly responding (i.e. relaxing) tissue parts can be excited. This has a decisive influence on the contrast appearing in the MR image. Measurement sequences 100 are thus likewise to be adapted for the respective selected protocol (i.e. the selected clinical examination) so that a maximum information gain can be achieved for the physician. For example, this applies for the assessment of a cancerous tissue variation that a physician would like to deal with. Measurement sequences 100 for an MR scanner 4 consist of a series of time slices 10 that result from the physical properties of the nuclear spins and the respective tissue.

The time relationship of the individual time slices 11 with one another is thereby a highly sensitive parameter. Each of these time slices 11 has an arbitrary length. A type can be associated with each time slice 11; a time slice is either of the warp type WT, the transmission type ST and/or the reception type ET. A time duration $T_x$ for the transmission and/or reception window, during which an RF pulse is sent and/or an RF signal is received, is associated with every time slice 11 of the transmission type ST.

Figure 2:
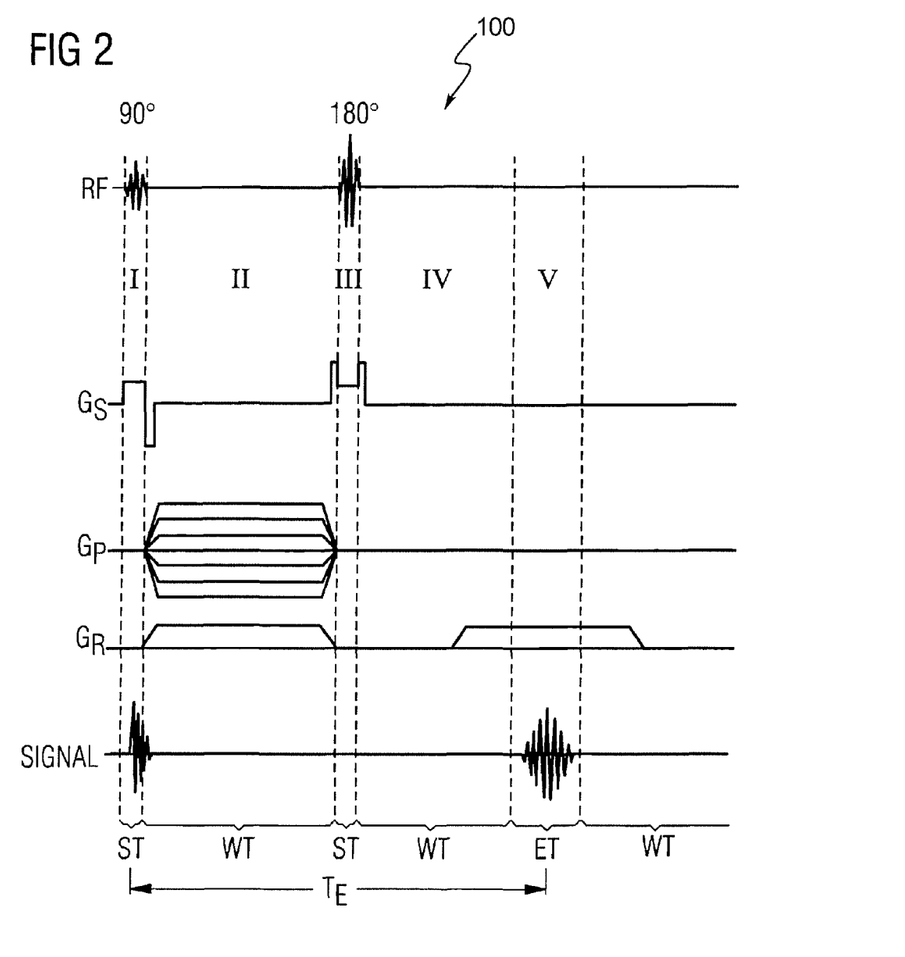
FIG. 2 illustrates the individual time slices of a spin echo sequence.

FIG. 2 shows an example of a simple measurement sequence 100 of what is known as the spin echo sequence. The temporal progression of a spin echo sequence is shown in FIG. 2. This diagram depicts the temporal progression of the activity in the RF circuit atop. Moreover, shown below this are the activities of three gradient systems $G_S$ (generally orthogonal to one another) for selection of a slice as well as $G_P$ known as a phase coding (phase-encoding) gradient, and moreover a readout gradient that is activated during the readout of the response signal. For a spin echo sequence, the spin system is initially excited with a 90° pulse, causing an echo to arise in the signal. Finally, after the echo time $T_E$ a spin echo that contains information for one line of an image is generated by a 180° pulse, as shown in FIG. 1. As indicated, the phase encode gradient $G_P$ is run through multiple times and its amplitude is varied from one pass to the next. The slice select gradient remains unchanged across all of these passes; the same applies for the readout gradient.

The individual time slice types are drawn, marked from left to right, in FIG. 2. The spin echo sequence thus initially begins with a time slice of the transmission type ST while the 90° pulse is radiated on the excitation side; following this is a time slice of the warp type WT to prepare the spin system. A new time slice with of the transmission type ST with the 180° pulse is next, followed by an additional warp block and finally the time slice of the reception type ET in which an echo is received as an RF signal. The time slice of the transmission type ST with the 180° pulse serves to refocus the nuclear spin system. The sequence repeats after the time slice of the reception type ET. For a spin echo sequence, such a pass up to $T_E$ delivers one line for an MR image in k-space. 128 lines are typically acquired for an image, for example. The image can be presented in position space via a suitable Fourier transformation, and an MR image is obtained.

The pulse shape $P_x$ to transmit an RF pulse within a time slice II within the measurement sequence 100 is normally provided as a continuous function that must be translated into a time raster of the MR scanner 4. It is thereby frequently the case that the time raster for the transmission and reception system is thus much finer for the RF circuit of the MR scanner than for the gradient coils 421, for instance. This is due to the fact that the strong gradient currents cannot be activated quickly for as long due to the self-induction of the gradient coils 421 that are used. Moreover, temporally variable magnetic fields may not exceed a defined edge steepness since otherwise peripheral nerve stimulation would be induced in the patient, meaning that individual members of the patient would be involuntarily induced to move, which is uncomfortable for the patient, in particular in a narrow tube of an MR scanner 4. Moreover, for a good MR acquisition it is necessary that the patient moves as little as possible.

A similar limitation applies to the RF circuit. Here it is to be ensured that the RF energy radiated over the course of the measurement sequence 100 does not exceed a certain limit value, for example 4 watts per kilogram of body weight. This is necessary in order to ensure that the tissue is not locally heated. If this limit value is not taken into account, the patient can be burned. The pulse sequence 100 therefore must account for such limitations. Since normally the slope of gradient pulses is significantly flatter than that of the RF pulses, an MR scanner possesses at least one time raster 5, normally even multiple time rasters 5a. It is now the task of the sequence programmer to translate the time correlations of individual time slices 11 with one another exactly into the time raster 5 of the MR scanner so that the calculated and/or physically present time correlations between the individual time slices 10 are represented as precisely as possible.

An object of the invention is a method to translate transmission and/or reception time slices for an execution in the time raster of the MR scanner 4. This method is shown (without limitation of generality) using a shortening of the time duration $T_x$ of the transmission and/or reception window for transmission of an RF pulse and/or reception of an RF signal.

This is in fact not a trivial task because it must be ensured on the one hand that the values passed to the hardware of the scanner 4 can be executed in the scanner. At the same time, global properties of the measurement sequence 100 (for instance $T_E$ for all passes of the measurement sequence 100) must be the same.

Conventionally, it has been the task of the MR sequence programmer to handle this programming with time raster adaptation himself or herself. The goal of the present invention is to significantly simplify the programming of measurement sequences to the effect that the translation of predetermined time durations $T_x$ into a time raster of a MR scanner 4 can ensue automatically. The method of the present invention therefore provides a time raster-adapted MR sequence which optimally utilizes the possibilities of the time raster of the MR scanner 4 and simultaneously ensures an optimal quality of the images.

The length of the individual time slices results from mathematically predetermined equations that are normally solved by a component known as a solver. This means that it has been necessary to conceive measurement sequence descriptions in problem descriptions for mathematical solvers. In this context, reference is made to the German Patent DE 10 2006 034 397 B3, the content of which is incorporated herein by reference. However, such solvers are overburdened if it is demanded of them that they output only those values that fit the predetermined time raster of the MR scanner. The calculation time of the solver would in this case rise significantly, even unacceptably so. The method according to the invention allows the time durations $T_x$ provided by the solver to be modified so that the time slices determined by the solver can be executed in the MR scanner.

Therefore it is an object of this invention to find a method that, starting from time durations $T_x$ provided by the solver, generates shortened time durations $T_{xi}$ that additionally optionally satisfy several optimization criteria.

Multiple pulse sequences $P_x$ can be associated with the time slices within a measurement sequence 100. A 90° excitation pulse is thus associated with the first time slice I in FIG. 2 as well as a slice selection pulse shape that is output by the gradient $G_s$.

It is the task of the sequence programmer to ensure that the temporal relationships of the individual pulse sequences that are present due to physical correlations are maintained among one another within the individual time slices. In particular, the surface integral below each pulse shape of a time slice is thereby of importance to magnetic resonance.

For time slices of the transmission and/or reception type, a digitization of the analog, received RF signals likewise occurs. It must thus be ensured that for an analog RF signal—for instance in the time slice of the ET type (V in FIG. 2)—an optimal digitization of the analog RF signal is possible with consideration of the minimum possible time interval in the time raster of the MR scanner.

Figure 3:
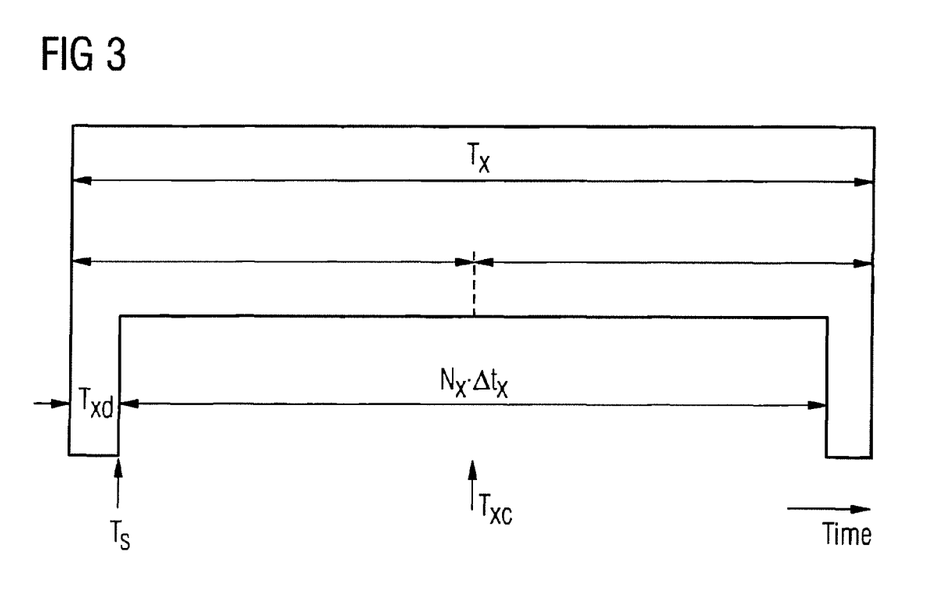
FIG. 3 shows a time duration $T_x$ and a shortened time duration $T_{xi}$ according to the method according to the invention.

Methods are already known for the translation of the gradient pulse series into a time raster of the MR scanner. In contrast to these, the method proposed within the scope of this invention is targeted at a time raster adaptation of the time slices of the transmission and/or reception type, wherein the time raster adaptation is realized by, for example, a shortening of the transmission and reception window of the time duration $T_x$. The method according to the invention is exemplarily illustrated for a time duration $T_x$ of the transmission and/or reception window, as is shown in FIG. 3.

The method according to the invention assumes that a sequence of the time slices is provided that was calculated from physical equations, for example, and whose translation into a form adapted to the time raster is accomplished by the method according to the invention for those time slices of the transmission and/or reception type.

In current MR scanners the time raster for the gradient system is, for example, 10 microseconds. Only insertions whose starting point in time lies in the time raster of the RF circuit can be realized at the transmission and reception channel. The insertion of events into the transmission or reception channel ensues as a number of sample points that are uniformly divided by the resolution (raster) time $\Delta t_x$. However, there is a predetermined minimum scan time $\Delta t_{min}$, i.e. a minimum time raster and a minimum time raster increment $\Delta t_{inc}$.

It is noted that transmission and reception channel can deviate from one another in the values of minimum time raster in the transmission channel and minimum time raster in the reception channel. However, it is convenient to keep respective time rasters in these channels identical. This is normally the case in current MR scanners 4. The event start schedule for an event is, for example, 100 ns; the minimum scan time is, for example, 1 μs; and the minimum increment is, for example, 100 ns. Insofar as the same limitations are used for transmission channel and reception channel, the treatment of transmission and/or reception events is simplified. It is therefore convenient to maintain the same limitations in the transmission and/or reception channel. However, at this point it should be stressed that the method is naturally in the position to also consider different limitations for the transmission channel and/or the reception channel. Frequency and/or phase events (thus those events that have an effect on the frequency of the nuclear spin system and/or its phase) are likewise defined in a predetermined time raster. This event schedule is, for example, 100 ns wide.

FIG. 3 shows an example the time duration $T_x$ of the transmission and/or reception window and the shortened time duration $T_{xi}$ in which the nodes $N_x$ are distributed with a scan time $\Delta t_x$. The event schedule in FIG. 3 is $\Delta T$ for the beginning of an event.

The conditions for the scan time $\Delta t_x$ are in particular $$(\Delta t_x - \Delta t_{min}) \bmod \Delta t_{inc} = 0.$$

This condition states that the selected scan time $\Delta t_x$ or, respectively, the selected time raster is divisible by the time raster increment $\Delta t_{inc}$ without remainder. The selected time raster this results as an integer multiple of the minimum time raster increment $\Delta t_{inc}$.

During the execution of the time raster-adapted measurement sequence, it must moreover be ensure that the shortened time duration $T_{xi}$ generated by the method "locks into place" in the time raster of the scanner 4, which is only possible with the precision of the event schedule $\Delta T$. Also, the shortened time duration length $T_{xi}$ may not project beyond the time duration $T_x$ of the transmission and/or reception window. It is thereby ensured that the time raster adaptation can be executed locally (i.e. for time slice II) without having to taken into account the preceding time slice and the time slice following the time slice II. The following must therefore apply:

$$N_x \cdot \Delta t_x \leq T_x - \Delta T.$$

In the above form the number points with which a pulse shape $P_x$ of an RF pulse is digitized and/or an analog RF signal (for example an echo) is digitized, is the number of the nodes $N_x$.

Moreover, the sequence programmer can provide a minimum number of nodes $N_{xmin}$ for a shortened time duration $T_{xi}$. A maximum number of nodes $N_{xmax}$ for a shortened time duration $T_{xi}$ can also be provided according to $$N_{xmin} \leq N_x \leq N_{xmax}$$

based on the available memory and/or the possible data rate and/or limitations during the image reconstruction.

The algorithm to calculate the selected scan time $\Delta t_x$ and the number of nodes $N_x$ must preferably maximize the product of nodes and scan time, thus $N_x \cdot \Delta t_x$.

The time duration $T_{xi}$ is clearly shorter than the original time duration $T_x$ of the transmission and/or reception window. A small loss in resolution and/or bandwidth time product (in the tenth of a percent range up to a few percent) results from this.

A time slice that depicts a gradient pulse with constant gradient is exemplarily considered as a simple example of the resolution loss. The percentile loss then results as $$\delta = \frac{N_x \cdot \Delta t_x}{T_x} - 1$$

The percentile loss due to shortened time durations $T_x$ should be well below 1%.

It has also proven to be meaningful to ensure that a boundary condition of the formulated $$T_x \geq N_{xmin} \cdot \Delta t_{min} \leq + \Delta T$$

is satisfied in the determination of $N_{xmin}$ in order to ensure that at least the minimum number of nodes $N_{xmin}$ can be accommodated in the shortened time duration $T_{xi}$. This is brought about either by the sequence developer and/or via a boundary condition for calculation of the measurement sequence timing by the solver.

For a time slice II whose duration $T_x$ of the transmission and/or reception window was predetermined, the center of the individual duration $T_x$ (which normally even coincides with the center of the time slice II) is normally decisive.

The asymmetry of the shortened time duration $T_{xi}$ is $a_{xi}$. The point in time of the center of the shortened time duration $T_{xi}$ is $T_{xc}$; the starting point in time of the shortened time duration is $T_s$. The delay of the shortened time duration $T_{xi}$ relative to the beginning of the time duration $T_x$ is $T_{xd}$. The asymmetry of the time duration $T_x$ is $a_{xb}$.

For the method according to the invention it is appropriate to calculate $T_s$ so that $a_{xi}$ as a measure of the asymmetry of the shortened time duration $T_{xi}$ is as close as possible to the value for $a_{xb}$. Moreover, the following equations must be satisfied:

$$T_s \bmod \Delta T = 0$$
$$T_s + N_x \Delta t_x \le T_{xc} + (1 - a_{xb}) \cdot T_x$$
$$T_s \ge T_{xc} - a_{xb} \cdot T_x$$
$$T_{xd} = T_s - (T_{xc} - a_{xb} \cdot T_x)$$
$$a_{xi} = \frac{T_{xc} - T_s}{N_x \cdot \Delta t_x}$$

At present only the time duration $T_x$ of one of the transmission and/or reception windows is communicated to an MR scanner 4. The specification of additional information beyond this is necessary for execution of the shortened time duration $T_{xi}$, for example $T_{xd}$, $a_{xi}$, $N_x$ and $\Delta t_x$. Moreover, the product of nodes and the scan time is somewhat shorter than the time duration $T_x$. An asymmetry $a_{xi}$ that is slightly different than the asymmetry $a_{xb}$ of the time duration $T_x$ also results for the shortened time duration $T_{xi}$.

These facts will have effects on the first Fourier transformation within the scope of the image reconstruction and on the calculation of RF pulse shapes $P_x$. With regard to the Fourier transformation, a shift of the lines of data in k-space is possibly necessary since the method otherwise generates a jitter of the center signal. However, current Fourier transformation algorithms allow a fluctuation (oscillation) of the center position to be corrected, and moreover to communicate what the actual center frequency is to the algorithm, even if this does not lie exactly within the time raster of the MR scanner 4.

The shortening of the time duration $T_x$ to the shortened time duration $T_{xi}$ leads to the situation that the sampled area in k-space is slightly reduced. A small resolution loss and a less precise definition of the selected slice thickness or of the slice selection gradient results from this. Given application of the method according to the invention, this loss is in the tenth of a percent range, at most in the range of a few percent. It is noted that current algorithms for Fourier transformation are no longer dependent on acquiring a number of nodes $N_x$ that result as a power of two. The speed of modern computers also allows Fourier transformations to be implemented for a number of nodes $N_x$ that deviates from $2^N$. Given the speed of current hardware, the increased run time of such a Fourier transformation can be accepted, such that more freedom exists for the minimum number of nodes.

With regard to the pulse shapes $P_x$ that are used as they exist for use with the transmission and/or reception window of the time duration $T_x$, re-digitization (i.e. "resampling") must possibly occur for the use during shortened time durations $T_{xi}$.

This can occur in a manner as it is already known for gradients. This means that it is in particular to be ensured that the surface integral is transformed according to $$G_i = \frac{1}{\Delta t} \int_{(i+1)\Delta t}^{i \cdot \Delta t} G(t)\,dt$$

This means that the integral under the pulse shape $P_x$ must also be maintained for the shortened time duration $T_{xi}$ and be translated accurately with regard to the surface. A modification of the surface under the integral would have effects on the effect of the pulse shape, in particular on the $B_1$ field strength. In a more complex notation, the $B_1$ field strength is given as an amplitude portion $B_{1Amp}(t)$ and a phase portion $B_{1Ph}(t)$ via:

$$B_1(t) = B_{1Amp}(t) \cdot e^{iB_{1Ph}(t)}$$

And therefore $$B_{1N,i} = \frac{1}{\Delta t} \int_{i \cdot \Delta t}^{(i-1)\Delta t} B_{1N}(t)\,dt$$

with $N \in \{Amp, Ph\}$ applies for the resampling of every $B_1$ component. Local errors thereby result between the nodes, but these local errors do not propagate beyond a time duration $T_{xi}$ and therefore also not beyond the time slice II.

A recalculation of the nodes for the actual $\Delta t$ that is used is possibly necessary for Shinnar-Le Roux pulses. Refer in this context to J. Pauly, P. Le Roux, D. Nishimura, and A. Macovski, "Parameter Relations for the Shinnar-Le Roux Selective Excitation Pulse Design Algorithm", in IEEE Trans. Med. Imaging, 10 (1991), 53-65.

The method proposed in this context was described using the time duration $T_x$ of the transmission and/or reception window since a particularly brief description can be made in this formulation. In particular, given this approach each of the time slices can be considered individually without the preceding time slice and the time slice following the time slice having to be known for execution of the method. Moreover, a retention of gradient moments or moments of pulse shapes is automatically ensured.

The method according to the invention can alternatively also be formulated via the shortening of the length of time slices of the transmission and/or reception type. A shortened time slice would thus be generated. The time slices adjoining the shortened time slice would have to be correspondingly lengthened in order to also maintain the global properties of the predetermined measurement sequence 100 for the time raster-adapted measurement sequence.

The method according to the invention is selected such that it is automatically ensured that no infractions of hardware limitations are introduced, for instance with regard to the edge steepness of the gradients. In other words, this means that insofar as the time slices of the predetermined measurement sequence 100 respect the hardware limitations, these are also maintained for the time raster-adapted measurement sequence according to the invention.

The same applies for the accounts for the administration of the dose of RF energy administered to the patient over the course of the measurement sequence 100. This load is likewise not changed or, respectively, automatically maintained via the method according to the invention without having to execute further additional steps for this.

Moreover, a method according to the present invention is a necessary requirement in order to be able to execute in the MR scanner 4 a sequence timing as a series of time slices of arbitrary length as it is determined by the solver. The sequence timing supplied by the solver is not necessarily executable in the time raster 5 of the MR scanner.

If the method according to the invention is executed in a series of time slices provided by the solver, the determined, time raster-adapted measurement sequence can be executed directly in the MR scanner.

The method could therefore be executed directly as part of a solver after this has initially determined a series of time slices that are not adapted to the time raster.

The method could also accordingly also be situated before an input interface of the MR scanner, there receiving the series of time slices of the predetermined measurement sequence 100 that is determined by the solver. The method according to the invention is then executed on each of the time slices, so a time raster-adapted measurement sequence is generated that is provided to the input interface of the MR scanner, whereupon this executes the time raster-adapted measurement sequence 101.

The method according to the invention allows optimization criteria 15 to be individually provided for shortening of the time duration $T_x$. In practice, groups of time slices can be combined for which the same optimization criteria apply. In practice this results from, for example, time slices that belong to the same patient slice.

Although modifications and changes may be suggested by those skilled in the art, it is the intention of the inventors to embody within the patent warranted hereon all changes and modifications as reasonably and properly come within the scope of their contribution to the art.

We claim as our invention:

1. A method to generate an adapted measurement sequence for operating a magnetic resonance data acquisition unit, said magnetic resonance data acquisition unit comprising an inherent time raster that defines time durations between successive events that occur during operation of the magnetic resonance data acquisition system to acquire magnetic resonance data from a subject in the magnetic resonance data acquisition system, said method comprising the steps of:
 entering a predetermined measurement sequence for operating said magnetic resonance data acquisition system into a computerized device, said predetermined measurement sequence comprising a series of time slices respectively of arbitrary lengths, said time slices being selected from the group consisting of transmission type and reception type, and each time slice having a time duration associated therewith, said time duration defining a window in which at least one electromagnetic pulse is transmitted or received in said predetermined measurement sequence, said predetermined measurement sequence exhibiting global properties;
 in said computerized device, identifying said time raster of said magnetic resonance data acquisition system;
 in said computerized device, automatically determining optimization criteria for abbreviating the time duration of at least one of said time slices in said predetermined measurement sequence;
 for each time slice in said predetermined measurement sequence that was abbreviated by said optimization criteria, shortening the time duration thereof to a shortened time duration, each shortened time duration fitting into said time raster with no remainder and being completely within the time duration of the time slice in the predetermined measurement sequence, by satisfying said optimization criteria; and
 in said computerized device, automatically generating an adapted measurement sequence by replacing the time duration for any of said time slices in said predetermined measurement sequence for which a shortened time duration was determined, while maintaining said global properties of said predetermined measurement sequence, and making said adapted measurement sequence available at an output of said computerized device.

2. A method as claimed in claim 1 comprising employing a solver as said computerized device.

3. A method as claimed in claim 1 wherein said predetermined measurement sequence comprises a plurality of nodes that define respective shapes of said electromagnetic pulses, and comprising, in said computerized device, setting a permissible value range for said plurality of nodes.

4. A method as claimed in claim 1 comprising employing optimization criteria in said computerized device comprising a set of further time rasters that represent respective simplifications of said time raster of said magnetic resonance data acquisition system.

5. A method as claimed in claim 1 wherein said predetermined measurement sequence comprises a plurality of nodes that define respective shapes of said electromagnetic pulses, and wherein said time raster comprises a minimum time interval between said successive events, and comprising employing, in said optimization criteria, a maximization of a product of said plurality of nodes and said minimum time duration.

6. A method as claimed in claim 1 wherein at least one of said time slices comprises transmission of a radio-frequency pulse having a pulse shape, and wherein the step of generating said adapted measurement sequence comprises modifying said pulse shape to conform to said shortened time duration.

7. A method as claimed in claim 1 wherein inclusion of at least one shortened time duration in said adapted measurement sequence produces erroneous magnetic resonance data, and comprising automatically processing said erroneous magnetic resonance data to correct errors therein arising due to said at least one shortened time duration.

8. A method as claimed in claim 1 comprising:
 in said computerized device, identifying hardware limitations of said magnetic resonance data acquisition system; and
 in said computerized device, automatically checking said predetermined measurement sequence as to whether the detected hardware limitations are complied with by said predetermined measurement sequence.

9. A method as claimed in claim 1 comprising:
 in said computerized device, identifying patient safety guidelines; and
 in said computerized device, automatically checking whether said predetermined measurement sequence adheres to said patient safety guidelines.

10. A device to generate an adapted measurement sequence for operating a magnetic resonance data acquisition unit, said magnetic resonance data acquisition unit comprising an inherent time raster that defines time durations between successive events that occur during operation of the magnetic resonance data acquisition system to acquire magnetic resonance data from a subject in the magnetic resonance data acquisition system, said device comprising:
 an input interface module configured to receive a predetermined measurement sequence for operating said magnetic resonance data acquisition system into a computerized device, said predetermined measurement sequence comprising a series of time slices respectively of arbitrary lengths, said time slices being selected from the group consisting of transmission type and reception type, and each time slice having a time duration associated therewith, said time duration defining a window in which at least one electromagnetic pulse is transmitted or received in said predetermined measurement sequence, said predetermined measurement sequence comprising global properties;

a time raster interface module configured to receive said time raster of said magnetic resonance data acquisition system;

an optimization criteria module configured to automatically determine optimization criteria for abbreviating the time duration of at least one of said time slices in said predetermined measurement sequence;

a shortening module that, for each time slice in said predetermined measurement sequence that was abbreviated by said optimization criteria, shortens the time duration thereof to a shortened time duration, each shortened time duration fitting into said time raster with no remainder and being completely within the time duration of the time slice in the predetermined measurement sequence, by satisfying said optimization criteria; and a generator module that automatically generates an adapted measurement sequence by replacing the time duration for any of said time slices in said predetermined measurement sequence for which a shortened time duration was determined, while maintaining said global properties of said predetermined measurement sequence, and makes said adapted measurement sequence available as an output.

11. A magnetic resonance system comprising:

a magnetic resonance data acquisition unit, said magnetic resonance data acquisition unit comprising an inherent time raster that defines time durations between successive events that occur during operation of the magnetic resonance data acquisition system to acquire magnetic resonance data from a subject in the magnetic resonance data acquisition system;

a controller that operates said data acquisition unit, said controller comprising an input interface module configured to receive a predetermined measurement sequence for operating said magnetic resonance data acquisition system into a computerized device, said predetermined measurement sequence comprising a series of time slices respectively of arbitrary lengths, said time slices being selected from the group consisting of transmission type and reception type, and each time slice having a time duration associated therewith, said time duration defining a window in which at least one electromagnetic pulse is transmitted or received in said predetermined measurement sequence, said predetermined measurement sequence comprising global properties, a time raster interface module configured to receive said time raster of said magnetic resonance data acquisition system, an optimization criteria module configured to automatically determine optimization criteria for abbreviating the time duration of at least one of said time slices in said predetermined measurement sequence, a shortening module that, for each time slice in said predetermined measurement sequence that was abbreviated by said optimization criteria, shortens the time duration thereof to a shortened time duration, each shortened time duration fitting into said time raster with no remainder and being completely within the time duration of the time slice in the predetermined measurement sequence, by satisfying said optimization criteria, and a generator module that automatically generates an adapted measurement sequence by replacing the time duration for any of said time slices in said predetermined measurement sequence for which a shortened time duration was determined, while maintaining said global properties of said predetermined measurement sequence, and makes said adapted measurement sequence available as an output;

entering a predetermined measurement sequence for operating said magnetic resonance data acquisition system into a computerized device, said predetermined measurement sequence comprising a series of time slices respectively of arbitrary lengths, said time slices being selected from the group consisting of transmission type and reception type, and each time slice having a time duration associated therewith, said time duration defining a window in which at least one electromagnetic pulse is transmitted or received in said predetermined measurement sequence, said predetermined measurement sequence comprising global properties;

in said computerized device, identifying said time raster of said magnetic resonance data acquisition system;

in said computerized device, automatically determining optimization criteria for abbreviating the time duration of at least one of said time slices in said predetermined measurement sequence;

for each time slice in said predetermined measurement sequence that was abbreviated by said optimization criteria, shortening the time duration thereof to a shortened time duration, each shortened time duration fitting into said time raster with no remainder and being completely within the time duration of the time slice in the predetermined measurement sequence, by satisfying said optimization criteria;

in said computerized device, automatically generating an adapted measurement sequence by replacing the time duration for any of said time slices in said predetermined measurement sequence for which a shortened time duration was determined, while maintaining said global properties of said predetermined measurement sequence, and making said adapted measurement sequence available at an output of said computerized device; and said controller operating said data acquisition unit according to said adapted measurement sequence.

12. A non-transitory computer-readable medium encoded with programming instructions to generate an adapted measurement sequence for operating a magnetic resonance data acquisition unit, said magnetic resonance data acquisition unit comprising an inherent time raster that defines time durations between successive events that occur during operation of the magnetic resonance data acquisition system to acquire magnetic resonance data from a subject in the magnetic resonance data acquisition system, said medium being loaded into a computerized device and said programming instructions causing said device to:

receive a predetermined measurement sequence for operating said magnetic resonance data acquisition system into a computerized device, said predetermined measurement sequence comprising a series of time slices respectively of arbitrary lengths, said time slices being selected from the group consisting of transmission type and reception type, and each time slice having a time duration associated therewith, said time duration defining a window in which at least one electromagnetic pulse is transmitted or received in said predetermined measurement sequence, said predetermined measurement sequence comprising global properties;

receive said time raster of said magnetic resonance data acquisition system;

automatically determine optimization criteria for abbreviating the time duration of at least one of said time slices in said predetermined measurement sequence;

for each time slice in said predetermined measurement sequence that was abbreviated by said optimization criteria, shorten the time duration thereof to a shortened time duration, each shortened time duration fitting into said time raster with no remainder and being completely within the time duration of the time slice in the predetermined measurement sequence, by satisfying said optimization criteria; and automatically generate an adapted measurement sequence by replacing the time duration for any of said time slices in said predetermined measurement sequence for which a shortened time duration was determined, while maintaining said global properties of said predetermined measurement sequence, and make said adapted measurement sequence available at an output of said computerized device.

* * * * *